(12) United States Patent
Yu et al.

(10) Patent No.: US 12,144,127 B2
(45) Date of Patent: Nov. 12, 2024

(54) FLEXIBLE DISPLAY PANEL AND DISPLAY DEVICE

(71) Applicant: Hefei Visionox Technology Co., Ltd., Anhui (CN)

(72) Inventors: Fengzhi Yu, Anhui (CN); Mingfu Zhang, Anhui (CN); Tao Zhou, Anhui (CN); Wenyi Zhao, Anhui (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 280 days.

(21) Appl. No.: 17/665,771

(22) Filed: Feb. 7, 2022

(65) Prior Publication Data

US 2022/0159848 A1   May 19, 2022

Related U.S. Application Data

(63) Continuation of application No. PCT/CN2021/070323, filed on Jan. 5, 2021.

(30) Foreign Application Priority Data

Feb. 28, 2020   (CN) .......................... 202010130770.3

(51) Int. Cl.
*H05K 5/00* (2006.01)
(52) U.S. Cl.
CPC ................. *H05K 5/0017* (2013.01)
(58) Field of Classification Search
CPC .............................. H05K 5/0017; G09F 9/301
See application file for complete search history.

(56) References Cited

U.S. PATENT DOCUMENTS

| | | | | |
|---|---|---|---|---|
| 9,818,961 B2* | 11/2017 | Hiroki | ..................... | G09F 9/301 |
| 10,198,041 B2* | 2/2019 | Myeong | ................ | G06F 1/1681 |
| 10,694,623 B2* | 6/2020 | Park | ..................... | H05K 5/0226 |
| 11,395,415 B2* | 7/2022 | Gu | ......................... | G06F 1/1601 |
| 2016/0014882 A1* | 1/2016 | Jongman | ............. | G02F 1/13452 |
| | | | | 156/247 |
| 2017/0142847 A1* | 5/2017 | Park | ..................... | H05K 5/0226 |

(Continued)

FOREIGN PATENT DOCUMENTS

| CN | 103985321 A | 8/2014 |
|---|---|---|
| CN | 105206649 A | 12/2015 |
| CN | 107633775 A | 1/2018 |

(Continued)

OTHER PUBLICATIONS

PCT International Search Report for International Application No. PCT/CN2021/070323 dated Mar. 12, 2021.

(Continued)

*Primary Examiner* — Anthony Q Edwards
*Assistant Examiner* — Hung Q Dang
(74) *Attorney, Agent, or Firm* — Rimon PC (57) ABSTRACT

A flexible display panel includes a flexible display body and a supporting structure disposed on a side of the flexible display body. The supporting structure includes a plurality of supporting layers disposed on a stack and a flexible layer disposed between each two adjacent supporting layers. An angle between at least one supporting layer of the plurality of supporting layers and a plane where a display surface of the flexible display body is located is greater than 0° and less than 90°.

20 Claims, 8 Drawing Sheets

(56) References Cited

U.S. PATENT DOCUMENTS

2020/0209916 A1* 7/2020 Zhang .................. G06F 1/1637
2022/0320464 A1* 10/2022 Wang .................. H10K 50/844

FOREIGN PATENT DOCUMENTS

| | | | |
|---|---|---|---|
| CN | 108470523 | A | 8/2018 |
| CN | 109064894 | A | 12/2018 |
| CN | 208444535 | U | 1/2019 |
| CN | 109318558 | A | 2/2019 |
| CN | 109449290 | A | 3/2019 |
| CN | 110164310 | A | 8/2019 |
| CN | 110264887 | A | 9/2019 |
| CN | 110265438 | A | 9/2019 |
| CN | 209461079 | U | 10/2019 |
| CN | 110635014 | A | 12/2019 |
| CN | 111292625 | A | 6/2020 |
| KR | 20190060904 | A | 6/2019 |

OTHER PUBLICATIONS

PCT Written opinion for International Application No. PCT/CN2021/070323 dated Mar. 12, 2021.
Chinese First Office Action for CN Application No. 202010130770.3 dated Jan. 25, 2021.
Chinese Second Office Action for CN Application No. 202010130770.3 dated Aug. 30, 2021.
Chinese Third Office Action for CN Application No. 202010130770.3 dated Jan. 18, 2022.

* cited by examiner

FLEXIBLE DISPLAY PANEL AND DISPLAY DEVICE

CROSS-REFERENCE TO RELATED APPLICATIONS

The present application is a continuation of International Application No. PCT/CN2021/070323, filed on Jan. 5, 2021, which claims priority to Chinese Patent Application No. 202010130770.3, filed on Feb. 28, 2020. All applications are incorporated herein by reference in their entireties.

TECHNICAL FIELD

Embodiments of the present application relate to the field of display technologies, in particular to a flexible display panel and a display device.

BACKGROUND

With the development of display technologies, application fields of display devices are very extensive, and therefore, performance requirements for screen bodies are gradually increasing. A flexible screen has characteristics such as being bendable. Users may bend or fold a display device, by using flexibility of the display device, thereby bringing convenience to carry and use the display device.

In the prior art, a flexible display screen is prone to display failure after being bent multiple times.

SUMMARY

Exemplary embodiments of the present application provide a flexible display panel and a display device, so as to solve a technical problem that a flexible display panel in the prior art is prone to display failure after being bent multiple times.

According to one aspect of the present application, a flexible display panel is provided. The flexible display panel includes a flexible display body and a supporting structure disposed on a side of the flexible display body. The supporting structure includes a plurality of supporting layers disposed on a stack and a flexible layer disposed between each two adjacent supporting layers. An angle between at least one supporting layer of the plurality of supporting layers and a plane where a display surface of the flexible display body is located is greater than 0° and less than 90°.

According to another aspect of the present application, a display device is provided. The display device includes a structure of the flexible display panel according to the exemplary embodiments of the present application.

In the flexible display panel according to the embodiments of the present application, the supporting structure is disposed on the side of the flexible display body. The supporting structure includes the plurality of supporting layers disposed on a stack and the flexible layer disposed between each two adjacent supporting layers. The angle between at least one supporting layer of the plurality of supporting layers and the plane where the display surface of the flexible display body is located is greater than 0° and less than 90°. An internal structure of the supporting structure forms a spring like structure, the plurality of supporting layers are equivalent to a spring bracket, and the flexible layer is equivalent to a gap structure in middle of the spring bracket. When the flexible display panel is bent, the supporting structure not only plays a supporting role, but also releases stress, thereby reducing a probability of falling off or peeling off between layers of the flexible display panel after being bent multiple times, reducing a probability of display failure of the flexible display panel, and increasing a service life of the flexible display panel. In addition, a position of a neutral layer is adjusted, by disposing the supporting structure, and an easily broken position in the flexible display panel is disposed as the neutral layer, so that the easily broken position is neither pulled nor stressed, thereby reducing a risk of screen failure due to breakage.

BRIEF DESCRIPTION OF DRAWINGS

FIG. 8b is a schematic structural diagram of the cross section in the thickness direction of the flexible display panel according to FIG. 8a.

DETAILED DESCRIPTION OF THE EMBODIMENTS

As described above, in the prior art, a flexible display screen is prone to a problem of display failure after being bent multiple times. The inventor found that a reason for the problem is that the flexible display panel includes multiple different film layers. The different film layers have different elastic modulus. Therefore, after the flexible display panel being bent multiple times, different film layers have different amounts of expansion and contraction when being bent. It is easy to peel, fall off, or even break or crack between two film layers, so that the display panel may display poorly.

An embodiment of the present application provides a flexible display panel. In the flexible display panel, a supporting structure is disposed on a side of a flexible display body. The supporting structure includes a plurality of supporting layers disposed on a stack and a flexible layer disposed between each two adjacent supporting layers. An angle between at least one supporting layer of the plurality of supporting layers and a plane where a display surface of the flexible display body is located is greater than 0° and less than 90°. An internal structure of the supporting structure forms a spring like structure, the plurality of supporting layers are equivalent to a spring bracket, and the flexible layer is equivalent to a gap structure in middle of the spring bracket. When the flexible display panel is bent, the supporting structure not only plays a supporting role, but also releases stress, thereby reducing a probability of falling off or peeling off between layers of the flexible display panel after being bent multiple times, reducing a probability of display failure of the flexible display panel, and increasing a service life of the flexible display panel.

Specifically, a flexible display panel is provided according to an embodiment of the present application. The flexible display panel includes a flexible display body and a supporting structure disposed on a side of the flexible display body. The supporting structure includes a plurality of supporting layers disposed on a stack and a flexible layer disposed between each two adjacent supporting layers. An angle between at least one supporting layer of the plurality of supporting layers and a plane where a display surface of the flexible display body is located is greater than 0° and less than 90°.

Technical schemes of the present application will be described clearly and completely below in combination with accompanying drawings. Obviously, described embodiments are only a part of embodiments of the present application, not all of the embodiments. Based on the embodiments in the present application, all other embodiments obtained by those skilled in the art without creative efforts shall fall within the protection scope of the present application.

Figure 1:
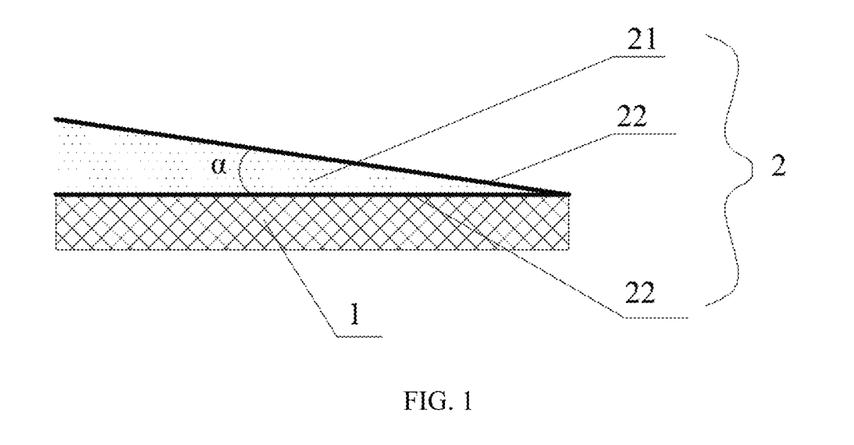
FIG. 1 is a schematic structural diagram of a flexible display panel according to an embodiment of the present application.

As shown in FIG. 1, a flexible display panel includes: a flexible display body 1 and a supporting structure 2 disposed on a side of the flexible display body 1. The supporting structure 2 includes a plurality of supporting layers 22 disposed on a stack and a flexible layer 21 disposed between each two adjacent supporting layers 22. An angle α between at least one supporting layer 22 of the plurality of supporting layers 22 and a plane where a display surface of the flexible display body 1 is located is greater than 0° and less than 90°.

In the flexible display panel according to the embodiments of the present application, the supporting structure 2 is disposed on the side of the flexible display body 1. The supporting structure 2 includes the plurality of supporting layers 22 disposed on a stack and the flexible layer 21 disposed between each two adjacent supporting layers 22. The angle α between at least one supporting layer 22 of the plurality of supporting layers 22 and the plane where the display surface of the flexible display body 1 is located is greater than 0° and less than 90°. An internal structure of the supporting structure 2 forms a spring like structure, the plurality of supporting layers 22 are equivalent to a spring bracket, and the flexible layer 21 is equivalent to a gap structure in middle of the spring bracket. When the flexible display panel is bent, the supporting structure 2 not only plays a supporting role, but also releases stress, thereby reducing a probability of falling off or peeling off between layers of the flexible display panel after being bent multiple times, reducing a probability of display failure of the flexible display panel, and increasing a service life of the flexible display panel. In addition, a position of a neutral layer is adjusted, by disposing the supporting structure 2, and an easily broken position in the flexible display panel is disposed as the neutral layer, so that the easily broken position is neither pulled nor stressed, thereby reducing a risk of screen failure due to breakage.

A material of the supporting layer 22 may be an inorganic material such as silicon oxide or silicon nitride. The material of the supporting layer 22 may also be a metal material such as titanium Ti or molybdenum Mo. The supporting layer 22 may be prepared by a method such as deposition. A material of the flexible layer 21 may be an organic material such as PR (Photoresist) or optically clear adhesive (OCA) with high recovery. The flexible layer 21 may be prepared by a method such as coating.

Figure 2:
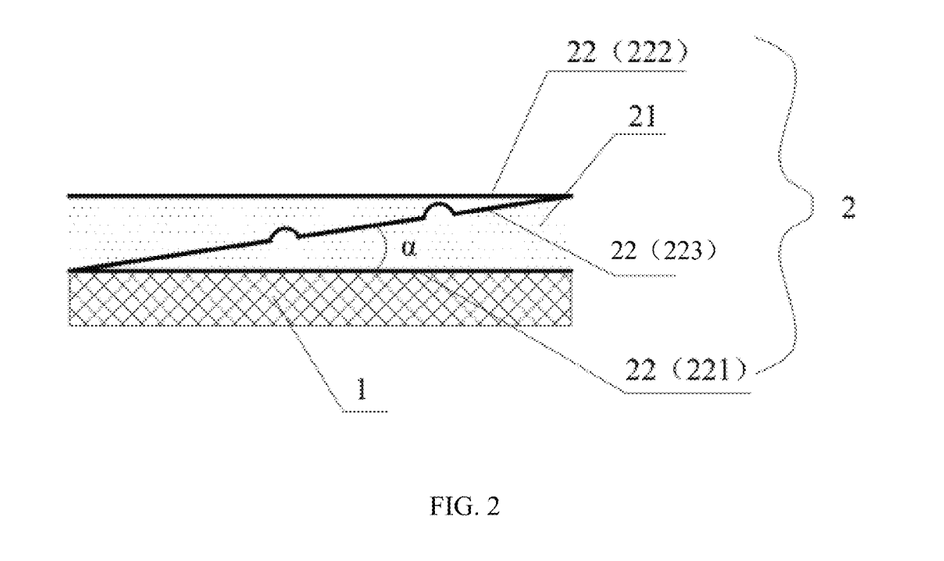
FIG. 2 is a schematic structural diagram of another flexible display panel according to an embodiment of the present application.
Figure 3:
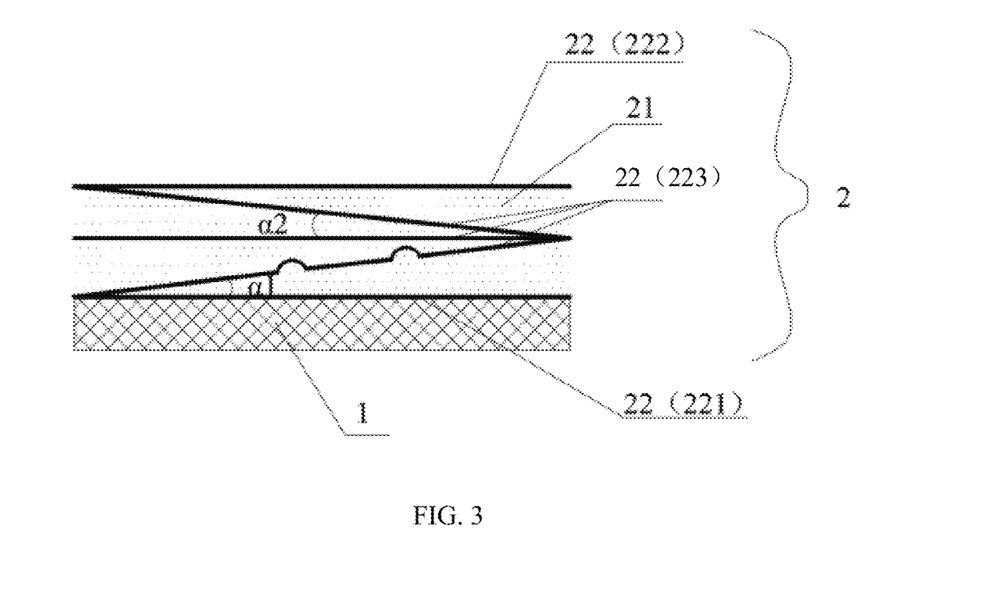
FIG. 3 is a schematic structural diagram of another flexible display panel according to an embodiment of the present application.

The number of the flexible layers 21 and the supporting layers 22 included in the supporting structure 2 may be selected according to an actual process requirement. For example, as shown in FIG. 1, when a thickness of the flexible display panel is small, the supporting structure 2 may only include two supporting layers 22 and one flexible layer 21. As shown in FIG. 2 and FIG. 3, when a flexibility requirement for the flexible display panel are relatively high, the supporting structure 2 may include N supporting layers 22 and N−1 flexible layers 21, and N is an integer greater than or equal to 3. Therefore, the embodiments of the present application do not limit the number of the flexible layers 21 and the supporting layers 22 included in the supporting structure 2.

Figure 4:
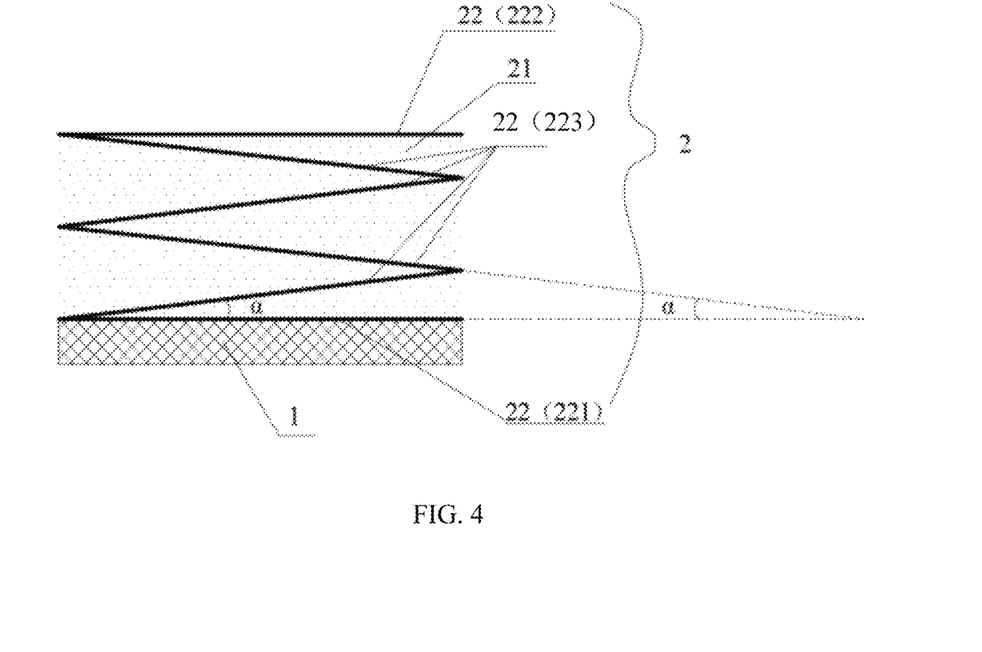
FIG. 4 is a schematic structural diagram of another flexible display panel according to an embodiment of the present application.

In an embodiment of the present application, as shown in FIG. 2 to FIG. 4, the plurality of supporting layers 22 of the supporting structure 2 include a first supporting layer 221, a second supporting layer 222 and at least one third supporting layer 223. The first supporting layer 221 is close to the flexible display body 1. The second supporting layer 222 is away from the flexible display body 1. The at least one third supporting layer 223 is between the first supporting layer 221 and the second supporting layer 222. An angle between the first supporting layer 221 and a plane where a display surface of the flexible display body 1 is located is zero. An angle between the second supporting layer 222 and a plane where a display surface of the flexible display body 1 is located is zero.

In the supporting structure 2 according to the embodiments of the present application, a film layer close to the flexible display body 1 and a film layer away from the flexible display body 1 are both the supporting layers and both are plane layers. Therefore, a bonding between the flexible display body 1 and the supporting structure 2 and a bonding between other film layers in the flexible display panel and the supporting structure 2 are smoother, so as to reduce generation of wrinkles, and reduce a probability of inter-layer peeling caused by non-adhesion between layers. At the same time, the film layer close to the flexible display body 1 and the film layer away from the flexible display body 1 are both disposed as the supporting layers, so as to make a preparation process simpler when the supporting structure 2 is prepared.

Optionally, in the supporting structure 2, the number of the supporting layers located between the first supporting layer 221 and the second supporting layer 222 may be selected according to an actual process. For example, as shown in FIG. 2, if the supporting structure 2 includes three supporting layers, the number of the supporting layers between the first supporting layer 221 and the second supporting layer 222 in the supporting structure 2 is 1(i.e. one third supporting layer 223), and the angle α between the supporting layer between the first supporting layer 221 and the second supporting layer 222 and the plane where the display surface of the flexible display body 1 is located is greater than 0° and less than 90°. As another example, as shown in FIG. 3, the supporting structure 2 includes five supporting layers, the supporting layer close to the flexible display body 1 is the first supporting layer 221, and the supporting layer close to a module structure 3 is the second supporting layer 222. Then the number of the supporting layers between the first supporting layer 221 and the second supporting layer 222 in the supporting structure 2 is 3(i.e. three third supporting layers 223), and an angle between two supporting layers in the three supporting layers and the plane where the display surface of the flexible display body 1 is located is greater than 0° and less than 90°.

Figure 5:
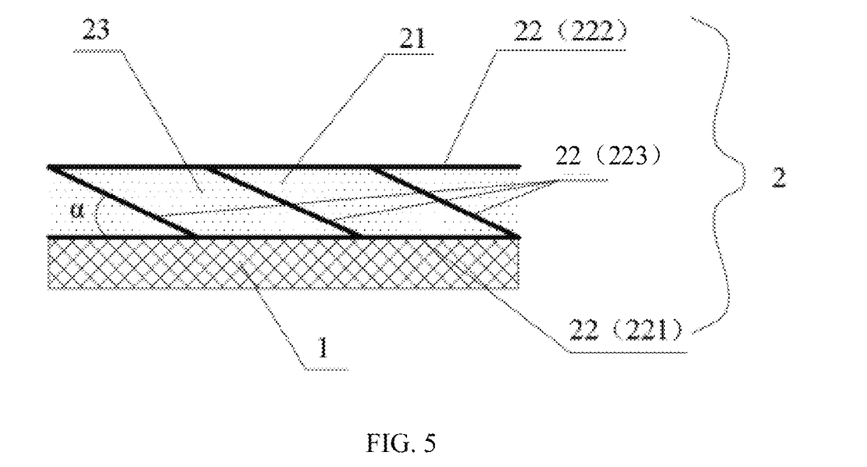
FIG. 5 is a schematic structural diagram of another flexible display panel according to an embodiment of the present application.

In an embodiment of the present application, as shown in FIG. 4 and FIG. 5, an angle between any third supporting layer 223 located between the first supporting layer 221 and the second supporting layer 222 and the plane where the display surface of the flexible display body 1 is located is greater than 0° and less than 90°. Since the angle between any third supporting layer 223 located between the first supporting layer 221 and the second supporting layer 222 and a plane where a display surface of the flexible display body 1 is located is greater than 0° and less than 90°, the internal structure of the supporting structure 2 forms a spring structure with stronger resilience. When the flexible display panel is bent, the probability of falling off or peeling off between various film layers of the flexible display panel after being bent multiple times is reduced.

In an embodiment of the present application, when the angle between any third supporting layer 223 located between the first supporting layer 221 and the second supporting layer 222 and a plane where the flexible display body 1 is located is greater than 0° and less than 90°, an orthographic projection of any third supporting layer 223 located between the first supporting layer 221 and the second supporting layer 222 on the flexible display body 1 covers at least a part of the flexible display body 1.

Optionally, any third supporting layer 223 located between the first supporting layer 221 and the second supporting layer 222 may be arranged as shown in FIG. 4. The orthographic projection of any third supporting layer 223 located between the first supporting layer 221 and the second supporting layer 222 on the flexible display body 1 covers the entire flexible display body 1. That is, the third supporting layers 223 disposed between the first supporting layer 221 and the second supporting layer 222 are sequentially disposed in a thickness direction of the display panel. The internal structure of the supporting structure 2 forms a spring structure in the thickness direction of the display panel. When the flexible display panel is bent, the probability of falling off or peeling off between various film layers of the flexible display panel after being bent multiple times is reduced.

Optionally, any third supporting layer 223 located between the first supporting layer 221 and the second supporting layer 222 may be arranged as shown in FIG. 5. The orthographic projection of any third supporting layer 223 located between the first supporting layer 221 and the second supporting layer 222 on the flexible display body 1 covers a part of the flexible display body 1. That is, the third supporting layers 223 disposed between the first supporting layer 221 and the second supporting layer 222 are sequentially disposed in a direction perpendicular to the thickness direction of the display panel. Therefore, the internal structure of the supporting structure 2 forms a spring structure in the direction perpendicular to the thickness direction of the display panel. When the flexible display panel is bent, the probability of falling off or peeling off between various film layers of the flexible display panel after being bent multiple times is reduced.

When the angle between any third supporting layer 223 located between the first supporting layer 221 and the second supporting layer 222 and the plane where the flexible display body 1 is located is greater than 0° and less than 90°, as long as the angle between any third supporting layer 223 located between the first supporting layer 221 and the second supporting layer 222 and the plane where the flexible display body 1 is located is greater than 0° and less than 90° and the orthographic projection of any supporting layer 22 on the flexible display body 1 can cover at least the part of the flexible display body 1. In the embodiments, whether the orthographic projection of any third supporting layer 223 located between the first supporting layer 221 and the second supporting layer 222 on the flexible display body 1, covers the entire flexible display body 1 or covers the part of the flexible display body 1 is not specifically limited.

Figure 6:
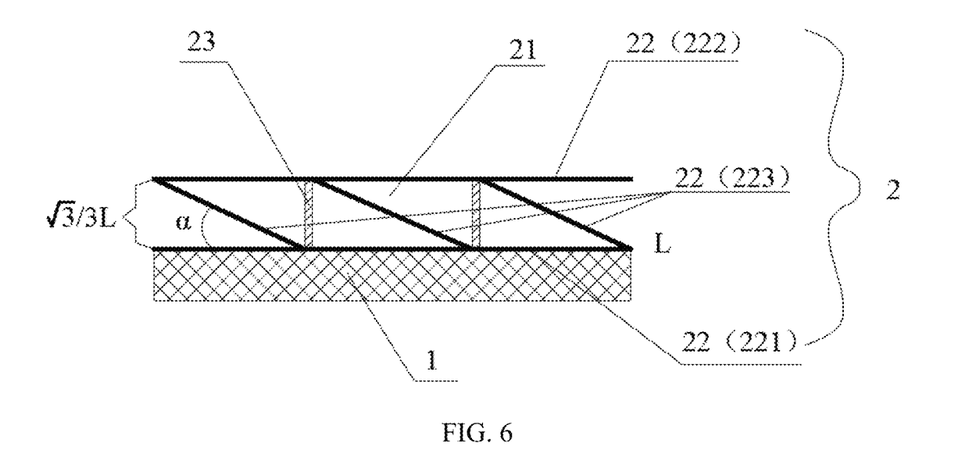
FIG. 6 is a schematic structural diagram of another flexible display panel according to an embodiment of the present application.

In an embodiment of the present application, as shown in FIG. 6, an angle between the at least one third supporting layer 223 and the plane where the display surface of the flexible display body 1 is located is greater than 0° and less than 90°. An orthographic projection of each third supporting layer 223 on the flexible display body 1 covers a part of the flexible display body 1. That is, any supporting layer 22 between the first supporting layer 221 and the second supporting layer 222 is sequentially disposed in the direction perpendicular to the thickness direction of the display panel. The supporting structure 2 further includes at least one supporting portion 23 disposed between the first supporting layer 221 and the second supporting layer 222. An angle between the supporting portion 23 and the plane where the display surface of the flexible display body is located is equal to 90°. One end of the supporting portion 23 is in contact with one end of the third supporting layer 223.

Figure 7:
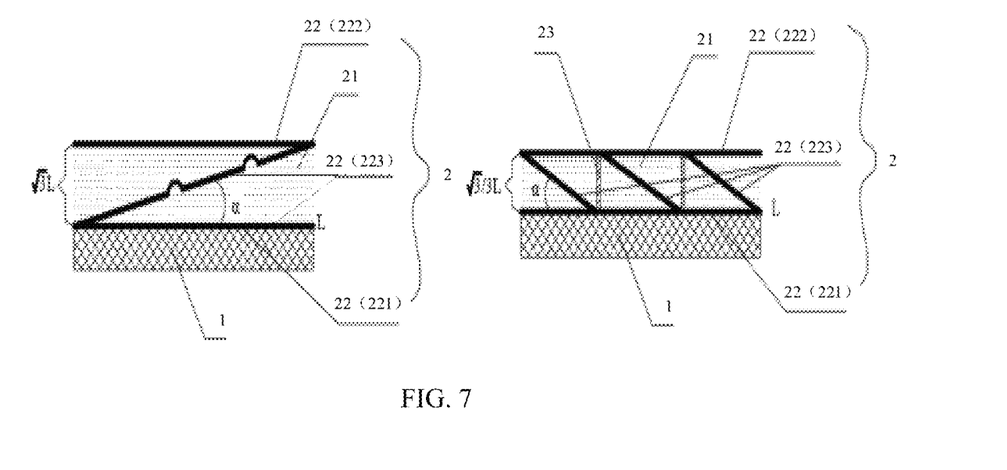
FIG. 7 is a schematic structural diagram of another flexible display panel according to an embodiment of the present application.

By disposing the supporting portion 23, a structure formed by each third supporting layer 223, the first supporting layer 221 and the second supporting layer 222 for supporting a part of the flexible display body 1 and a display module 3 has a better supporting force. In addition, referring to FIG. 7, in a case where the angle between the third supporting layer 223 and the plane where the display surface of the flexible display body 1 is located is the same, compared with the structure, formed by one third supporting layer 223, a first supporting layer 221 and a second supporting layer 222, for supporting the entire flexible display body 1 and the display module 3, the structure, formed by each third supporting layer 223, the first supporting layer 221 and the second supporting layer 222, for supporting a part of the flexible display body 1 and the display module 3 may reduce the thickness of the supporting structure 2 from $\sqrt{3}L$ to $\sqrt{3/3}L$. The thickness of the supporting structure 2 is reduced, so that a thickness of the entire display panel may be reduced, which is beneficial to realize the ultra-thin display panel.

Optionally, the material of the supporting portion 23 and the material of the first supporting layer 221 or the second supporting layer 222 may be the same.

In an embodiment of the present application, as shown in FIG. 2 and FIG. 3, in the at least three supporting layers 22 included in the supporting structure 2, in a direction from close to the flexible display body to away from the flexible display body 1, counting from the closest to the flexible display body 1, at least three supporting layers 22 constitute multiple supporting layer groups. Each supporting layer group includes three adjacent supporting layers 22 and two flexible layers 21 respectively disposed between two adjacent supporting layers 22. An angle between the supporting layers 22 on each side of each supporting layer group and the display surface of the flexible display body 1 is zero degree. An angle between the supporting layer 22 located in the middle and the plane where the display surface of the flexible display body 1 is located is greater than 0° and less than 90°. Film layers in contact with each other in the two adjacent groups of supporting layers are the same supporting layer 22.

As shown in FIG. 2 and FIG. 3, an internal structure of the supporting structure 2 according to the embodiment of the present application forms a spring like structure, the plurality of supporting layers 22 are equivalent to a spring bracket, and the flexible layer 21 is equivalent to a gap structure in middle of the spring bracket. When the flexible display panel is bent, the supporting structure 2 not only plays a supporting role, but also releases stress, thereby reducing a probability of falling off or peeling off between layers of the flexible display panel after being bent multiple times, reducing a probability of display poorly of the flexible display panel, and increasing a service life of the flexible display panel.

Figure 8A:
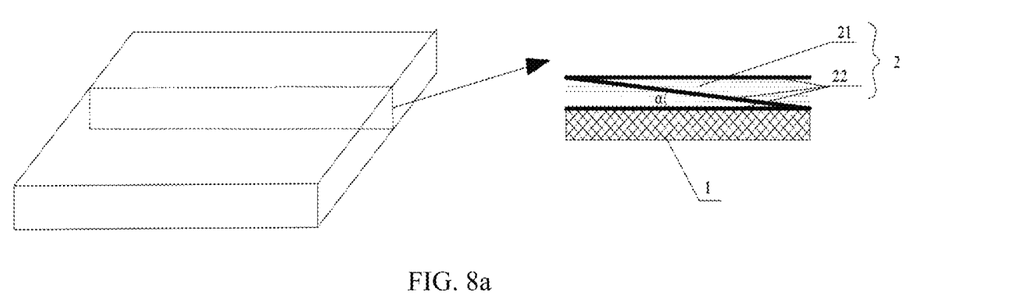
FIG. 8a is a schematic diagram of intercepting a cross section in a thickness direction of another flexible display panel according to an embodiment of the present application.
Figure 8B:
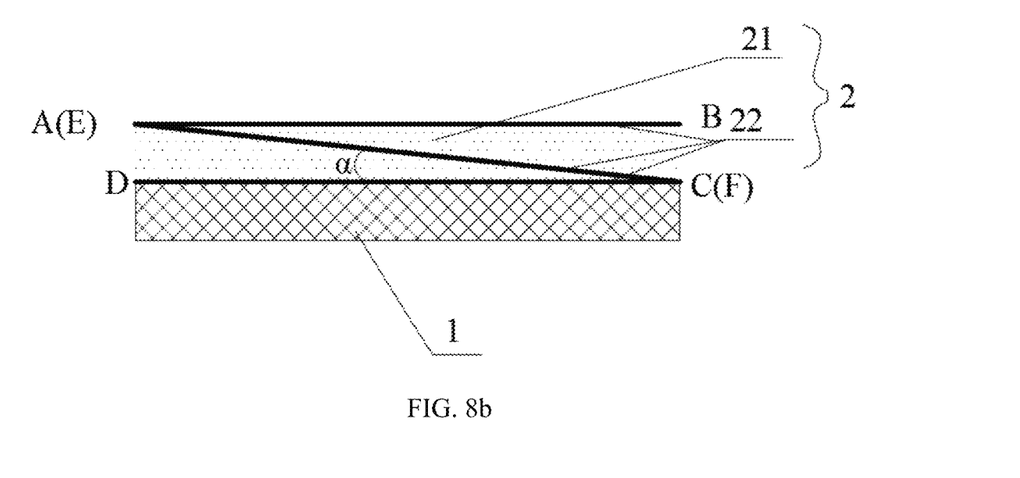

As shown in FIG. 8a and FIG. 8b, in a supporting layer group (including three supporting layers 22 and two flexible layers 21 respectively disposed between two adjacent supporting layers 22), as shown in FIG. 8a, a cross section in a thickness direction is a cross section in a vertical direction, and a specific cross section is shown in FIG. 8b. The cross section of the supporting layer group in the thickness direction of the flexible display panel is a first cross section, and the first cross section is represented by a rectangle ABCD shown in FIG. 8b. A cross section of the supporting layer 22 in the middle position, in the thickness direction of the flexible display panel, is a second cross section, and the second cross section is represented by a straight line EF shown in FIG. 8b. Cross sections of the two supporting layers 22 located on two sides, in the thickness direction of the flexible display panel, are a third cross section and a fourth cross section respectively. The third cross section is represented by a line AB shown in FIG. 8b, and the fourth cross section is represented by a line CD shown in FIG. 8b. One end E of the second cross section EF is in contact with a first end A of the third cross section AB. The other end F of the second cross section EF is in contact with a second end of the fourth cross section CD. A first end E and a second end F are respectively located on two diagonal corners of the first cross section ABCD. The probability of falling off or peeling off between layers of the flexible display panel after being bent multiple times is further reduced, the probability of display failure of the flexible display panel is reduced, and the service life of the flexible display panel is increased.

Figure 9:
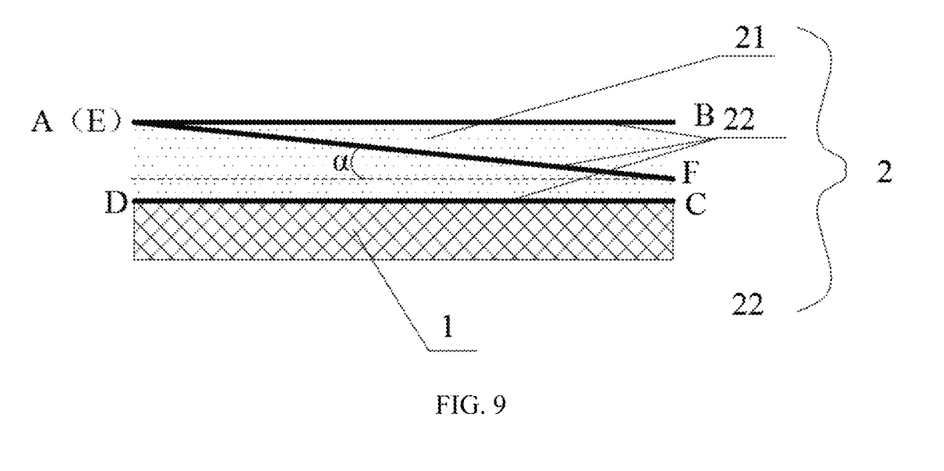
FIG. 9 is a schematic structural diagram of another flexible display panel according to an embodiment of the present application.

The first end E and the second end F may not only be located at two opposite corners of the first cross section ABCD, the first end E may also be located at any position on the third cross section AB and the second end F may also be located at any position on the fourth cross section CD. As shown in FIG. 9, the first end E of the second cross section EF may be in contact with the third cross section AB, and the second end F of the second cross section EF may not be in contact with the fourth cross section CD. That is to say, the second end F of the second cross section EF is on the connecting line BC of the corresponding ends of the third cross section AB and the fourth cross section CD. Therefore, the specific position of the second cross section in the first cross section is not limited by the embodiments of the present application.

In an embodiment of the present application, a first angle $\alpha$ between at least one supporting layer 22 of the plurality of supporting layers 22 of the supporting structure 2 and the plane where the display surface of the flexible display body 1 is located is greater than 0° and less than 90°. Optionally, an angle range of the first angle $\alpha$ is greater than 0° and less than or equal to 5°. Optionally, an angle range of the first angle $\alpha$ is greater than 0° and less than or equal to 2°.

Optionally, a value of the first angle $\alpha$ between at least one supporting layer 22 of the supporting structure 2 and the plane where the display surface of the flexible display body 1 is located is the same. That is, in the supporting structure 2, the angles between the supporting layers 22 and the plane where the display surface of the flexible display body 1 is located that are greater than 0° and less than 90° are all equal. As shown in FIG. 3, the supporting structure 2 includes the first supporting layer 221, the second supporting layer 222 and three third supporting layers 223 disposed between the first supporting layer 221 and the second supporting layer 222. Angles between two third supporting layers 223 and the display surface of the flexible display body 1 are $\alpha 1$ and $\alpha 2$ respectively, and $\alpha 1$ is equal to $\alpha 2$. Since $\alpha 2$ and $\alpha 1$ are equal, when the flexible display panel is bent, the various film layers in the supporting structure 2 are evenly distributed, and the bending stress released between the various film layers is also relatively uniform, thereby reducing a risk of individual film layers peeling or falling off due to uneven forces between the various film layers, reducing the probability of display poorly of the flexible display panel, and increasing the service life of the flexible display panel.

The number of supporting layers 22 including an angle with the plane on which the display surface of the flexible display body 1 is located being the first angle $\alpha$, in several supporting layers 22 of the supporting structure 2, may be selected according to actual application scenarios. The angle value of the first angle $\alpha$ may be selected according to actual application scenarios. The embodiments of the present application do not limit the number of supporting layers 22 including an angle with the plane where the display surface of the flexible display body 1 is located being the first angle $\alpha$, in several supporting layers 22 of the supporting structure 2. The embodiments of the present application do not limit the angle value of the first angle $\alpha$. For example, as shown in FIG. 3, when $\alpha 1$ is equal to $\alpha 2$, and $\alpha 1$ is equal to 3°, the angles between the two third supporting layers 223 and the display surface of the flexible display body 1 are both 3°.

In an embodiment of the present application, as shown in FIG. 1, the plurality of supporting layers 22 of the supporting structure 2 include a selected supporting layer. An angle between the selected supporting layer and the plane where the display surface of the flexible display body is located is greater than 0° and less than 90°. A cross section of the selected supporting layer in the thickness direction of the flexible display panel is a flat surface. The flat surface is inclined with respect to the plane where the display surface of the flexible display body 1 is located. When the supporting structure is prepared, the process is simple and the complexity of the process is reduced.

In another embodiment of the present application, as shown in FIG. 2 and FIG. 3, the third supporting layer 223 may be regarded as a selected supporting layer. The cross section of the selected supporting layer in the thickness direction of the flexible display panel is a curved surface with a concave convex structure. Since the curved surface has a convex concave structure, when the flexible display panel is bent, the convex concave structure may act as a buffer and release the bending stress, thereby further reducing the probability of falling off or peeling off between layers of the flexible display panel after being bent multiple times, reducing the probability of display failure of the flexible display panel, and increasing the service life of the flexible display panel.

It may be understood that a specific expression that the cross section with the selected supporting layer in the thickness direction of the flexible display panel is curved may be as shown in FIG. 2 or FIG. 3 (the cross section in the thickness direction of the flexible display panel is the cross section in the vertical direction). For example, the curved surface is wavy. The embodiments of the present application do not limit the specific expression form of the curved surface.

In an embodiment of the present application, the thickness of the supporting layer 22 is in a range from 20 nm to 50 nm, optionally 30 nm. If the thickness of the supporting layer 22 is too thick, the overall thickness of the entire flexible display panel may be too thick. If the thickness of the supporting layer 22 is too thin, the supporting effect may be limited. When the thickness of the supporting layer 22 is in the range from 20 nm to 50 nm, especially 30 nm, the inter layer peeling can be prevented, and the overall display panel to be too thick can not be caused.

Figure 10:
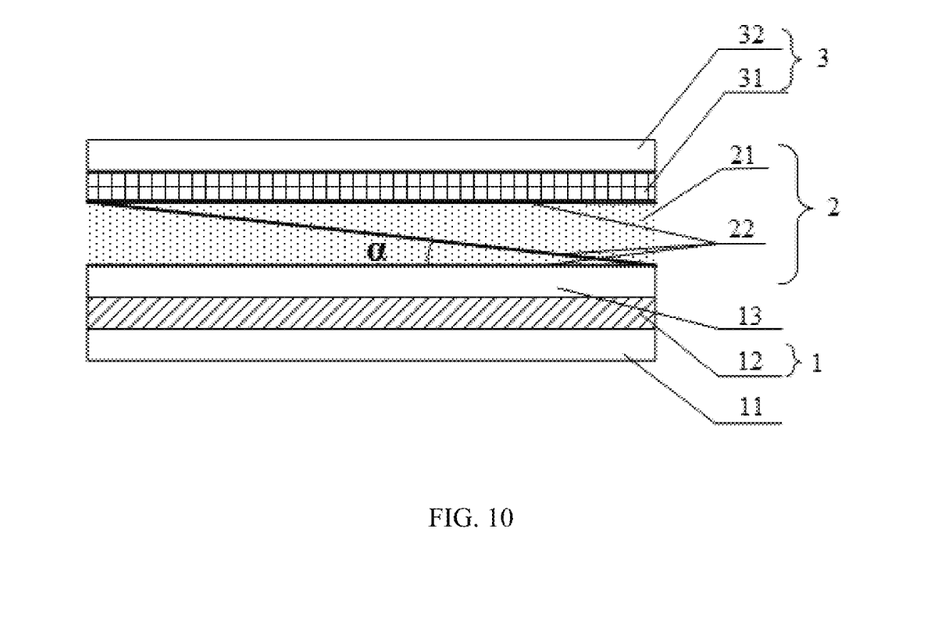
FIG. 10 is a schematic structural diagram of another flexible display panel according to an embodiment of the present application.

In an embodiment of the present application, as shown in FIG. 10, the flexible display body 1 includes a display device layer 12. The flexible display panel further includes an encapsulation layer 13 disposed on one side of the display device layer 12. The supporting layer 22 in the supporting structure 2 is an inorganic material layer or a metal layer. The flexible layer 21 is an organic material layer. The display device layer 12 includes a multilayer structure of an anode layer, a light emitting layer, and a cathode layer stacked along the display light emitting direction of the flexible display panel. The light emitting layer includes a plurality of sub-pixels for displaying light emission, and a multilayer structure in which two adjacent sub-pixels are separated from each other by a pixel interval area (the pixel interval area is the definition layer of the pixel). A specific structure of each sub-pixel may be, for example, a hole injection layer (HIL), a hole transport layer (HTL), an organic material light emitting layer (EML), an electron transport layer (ETL), and an electron injection layer (EIL) that are stacked. Active electrons in the cathode layer and holes generated by the anode layer are recombined in the light emitting layer to excite the organic light emitting material in the organic material light emitting layer to emit light.

In an embodiment of the present application, by disposing the encapsulation layer 13 on one side of the display device layer 12 for preventing water and oxygen from invading the display device layer 12, effectively reducing the probability of inactivation of the organic light emitting materials and increasing the service life of the flexible display panel.

Optionally, the encapsulation layer 13 may adopt a conventional structure in which at least one organic layer and at least one inorganic layer are alternately stacked. Optionally, since the supporting layer 22 in the supporting structure 2 is an inorganic material layer or a metal layer, and the flexible layer 21 is an organic material layer, a structure of the encapsulation layer 13 may also adopt the structure of the supporting structure 2. Optionally, a overlap structure between a part of the organic layer and the inorganic layer in the encapsulation layer 13 adopts the structure of the supporting structure 2, and a overlap structure between the other part of the organic layer and the inorganic layer adopts a conventional structure in which inorganic layers and organic layers are alternately stacked.

Figure 11:
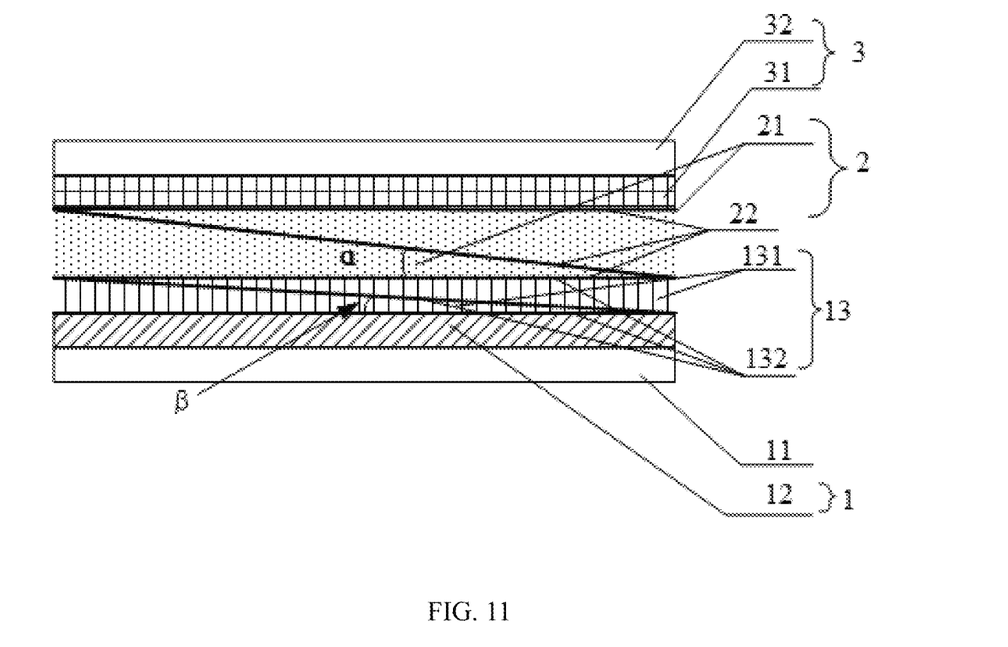
FIG. 11 is a schematic structural diagram of another flexible display panel according to an embodiment of the present application.

In an embodiment of the present application, as shown in FIG. 11, the encapsulation layer 13 includes the supporting structure 12. Optionally, the encapsulation layer includes a plurality of first inorganic layers disposed on a stack and a first organic layer 131 disposed between each two adjacent first inorganic layers 132. An angle between at least one first inorganic layer 132 of the plurality of first inorganic layers 132 and the plane where the display surface of the flexible display body 1 is located is greater than 0° and less than 90°. The encapsulation layer 13 includes the structure of the supporting structure 2, and the internal structure of the encapsulation layer 13 forms a spring like structure. The encapsulation layer 13 not only prevents water and oxygen from invading the display device layer 12, but also releases stress, thereby reducing the probability of falling off or peeling off between layers of the flexible display panel after being bent multiple times.

In an embodiment of the present application, as shown in FIG. 11, the encapsulation layer 13 includes the supporting structure 2. Optionally, the encapsulation layer 13 includes three the first inorganic layers 132 and the first organic layer 131 disposed between two adjacent first inorganic layers 132. An angle between the first inorganic layer 132 in a middle of the three first inorganic layer 132 and the display device layer 12 is β. β is greater than 0° and less than 90°. The internal structure of the encapsulation layer 13 forms a spring like structure. When the flexible display panel is bent, the encapsulation layer 13 not only plays the role of encapsulation, but also releases stress, thereby reducing the probability of falling off or peeling off between layers of the flexible display panel after being bent multiple times, reducing the probability of display poorly of the flexible display panel, and increasing the service life of the flexible display panel.

Figure 12:
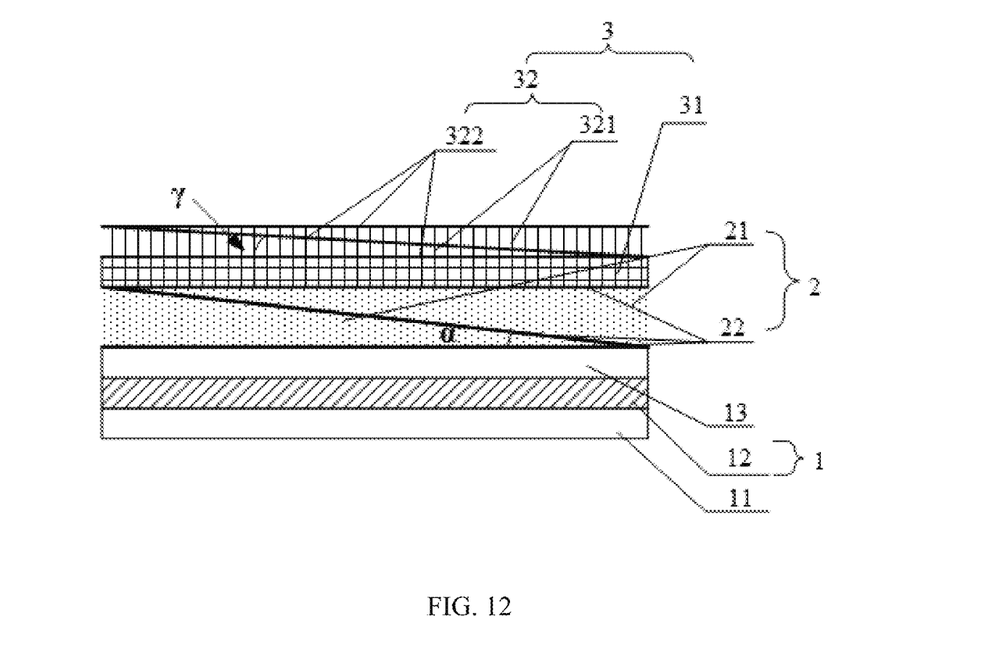
FIG. 12 is a schematic structural diagram of another flexible display panel according to an embodiment of the present application.

In an embodiment of the present application, as shown in FIG. 12, the flexible display panel further includes a module structure 3. The module structure 3 is disposed on one side of the supporting structure 2 away from the flexible display body 1. In an embodiment of the present application, by disposing the module structure 3 on one side of the supporting structure 2 away from the flexible display body, the supporting structure 2 is located between the flexible display body 1 and the module structure 3 while meeting other functional requirements of the flexible display panel, thereby reducing the probability of falling off or peeling off between layers after being bend.

Optionally, the module structure 3 may be a multi-layer structure including a polarizer layer 31 and a flexible cover layer 32 superimposed on one side of the polarizer layer away from the supporting structure. The flexible cover layer 32 may include the structure of the supporting structure 2, or may include a conventional flexible transparent polyimide film or ultra-thin glass. Polyimide film and ultra-thin glass have highly flexible, which may support the flexible display panel to withstand multiple bends.

In an embodiment of the present application, the flexible display panel further includes the module structure 3 on one side of the encapsulation layer 13, and the module structure 3 includes a flexible cover layer 32.

In a further embodiment of the present application, as shown in FIG. 12, the flexible cover layer 32 includes the supporting structure 2. The flexible cover layer 32 includes a plurality of second inorganic layers 322 disposed on a stack and a second organic layer 321 disposed between each two adjacent second inorganic layers 322. The angle α between at least one second inorganic layer 322 of the plurality of second inorganic layers 322 and the plane where the display surface of the flexible display body 1 is located is greater than 0° and less than 90°. The flexible cover layer 32 adopts the structure of the supporting structure 2. The internal structure of the flexible cover layer 32 forms a spring like structure. The flexible cover layer 32 releases stress and reduces the probability of falling off or peeling off between layers of the flexible display panel after being bent multiple times.

In an embodiment of the present application, as shown in FIG. 12, the flexible cover layer 32 includes the supporting structure 2. The flexible cover layer 32 includes three second inorganic layers 322 and two second organic layers 321 disposed between each two adjacent second inorganic layers 322. An angle between the second inorganic layer 322 in a middle of the three second inorganic layers 322 and a surface of a polarizer layer 31 is γ. γ is greater than 0° and less than 90°. The internal structure of the flexible cover layer 32 forms a spring like structure. When the flexible display panel is bent, the flexible cover layer 32 may release the stress, thereby reducing the probability of falling off or peeling off between layers of the flexible display panel after being bent multiple times, reducing the probability of display poorly of the flexible display panel, and increasing the service life of the flexible display panel.

Figure 13:
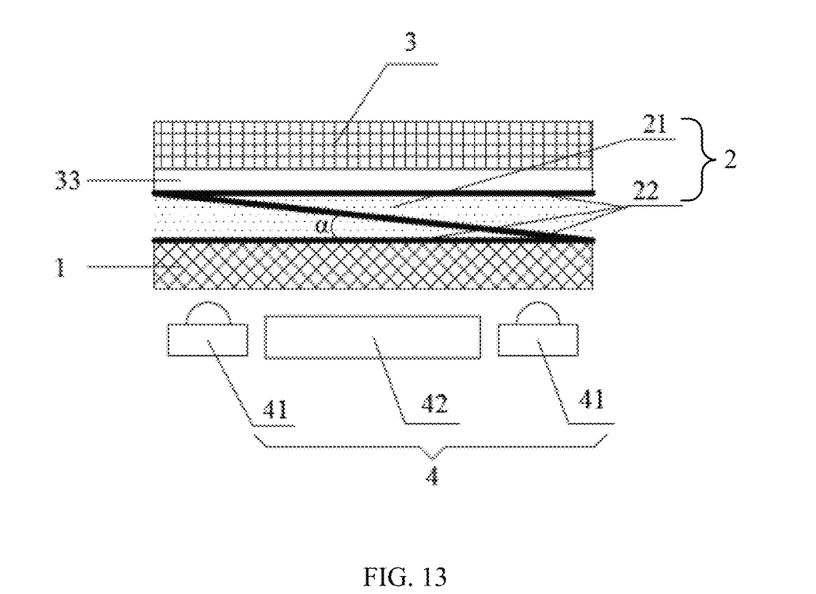
FIG. 13 is a schematic structural diagram of another flexible display panel according to an embodiment of the present application.

In an embodiment of the present application, as shown in FIG. 13, the flexible display panel further includes: a fingerprint detection unit 4 disposed on one side of the flexible display body 1 away from the module structure 3. The fingerprint detection unit 4 includes a emitting device 41 for emitting an infrared light beam, and a receiving device 42 for receiving an infrared light beam reflected from outside. The module structure 3 includes a light guide plate 33. A surface of the light guide plate 33 close to the fingerprint detection unit 4 includes a first area and a second area. The orthographic projection of the fingerprint area (that is, the area pressed by the finger) on the light guide plate 33 is located in the first area. The orthographic projection of the non-fingerprint area on the light guide plate 33 is located in the second area. That is, the first area of the light guide plate 33 corresponds to the fingerprint area. When the finger presses the display panel, the emitting device 41 emits an infrared light beam. A first refraction occurs when the infrared light beam passes through the light guide plate 33. After the first refraction, the infrared light beam will be reflected when it passes through the finger. A second refraction occurs when the reflected infrared light beam passes through the light guide plate 33 again. After the second refraction, the infrared light beam is incident in the receiving device 42. The receiving device 42 processes the received infrared light beam to finally form a fingerprint image, so as to achieve an effect of fingerprint recognition. That is, the flexible display panel has an under-screen fingerprint detection function, so that functions such as fingerprint recognition may be realized.

When the module structure 3 includes a light guide plate 33, that is, when the flexible display panel has an under-screen fingerprint detection function, the above mentioned supporting structure 2 may be disposed between the light guide plate 33 and the flexible display body 1.

Figure 14:
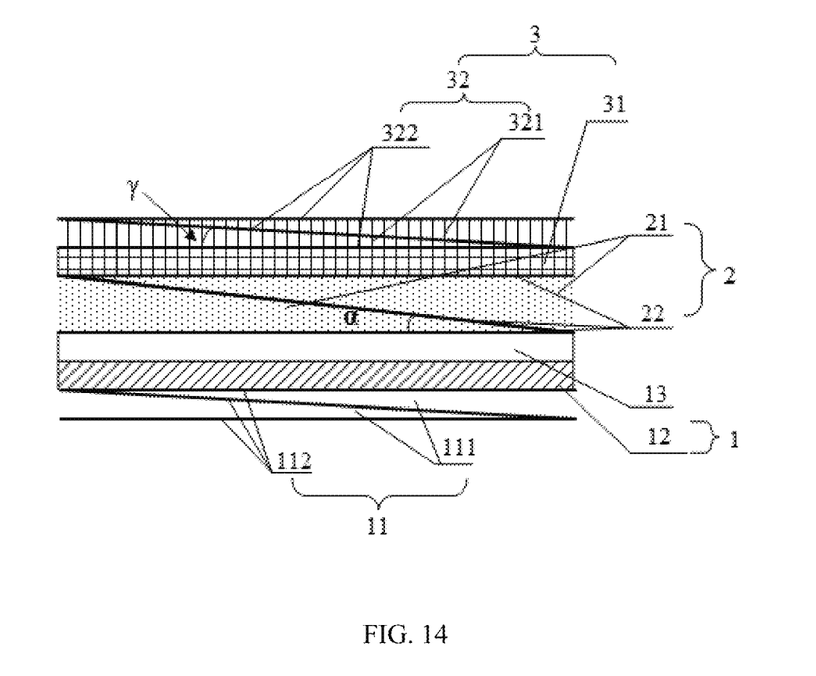
FIG. 14 is a schematic structural diagram of another flexible display panel according to an embodiment of the present application.

In another embodiment of the present application, as shown in FIG. 14, the flexible display panel further includes a flexible substrate 11 disposed on one side of the display device layer 12 away from the encapsulation layer 13. The flexible substrate 11 includes the supporting structure 2. The flexible substrate 11 includes three third inorganic layers 112 and a third organic layer 111 disposed between two adjacent third inorganic layers 112. An angle between the third inorganic layer 112 located in the middle of the three third inorganic layers 112 and the plane where the display surface of the display device layer 12 is located is greater than 0° and less than 90°. The internal structure of the flexible substrate 11 forms a spring like structure. When the flexible display panel is bent, the flexible substrate 11 may release the stress, which reduces the probability of falling off or peeling off between layers of the flexible display panel after being bent multiple times, reduces the probability of display poorly of the flexible display panel, and increases the service life of the flexible display panel.

In summary, the supporting structure 2 may exist in the flexible display panel in the following three situations.

(1) The internal structure of one of the film layers included in the flexible display panel may be the supporting structure 2 described above. That is, the supporting structure 2 reuses one film layer in the flexible display panel. For example, as shown in FIG. 11, the internal structure of the encapsulation layer 13 included in the flexible display panel may be the supporting structure 2 described above. For another example, as shown in FIG. 12, the internal structure of the flexible cover layer 32 included in the flexible display panel may also be the supporting structure 2 described above. For another example, as shown in FIG. 14, the internal structure of the flexible substrate 11 may also be the supporting structure 2 described above.

(2) The supporting structure 2 is separately disposed between the various film layers included in the flexible display panel. For example, the supporting structure 2 may be disposed between the display device layers 12 of the flexible substrate 11 shown in FIG. 10. For another example, the supporting structure 2 may be disposed between the display device layer 12 and the encapsulation layer 13 shown in FIG. 10.

(3) At least two adjacent film layers in the film layers included in the flexible display panel jointly constitute the supporting structure 2. For example, the polarizer layer and the flexible cover layer are designed as a whole as the internal structure of the supporting structure as described above.

The flexible display panel may include one supporting structure 2 or multiple supporting structures 2, and the above three situations may exist in one flexible display panel at the same time. For example, when the internal structure of a single film layer included in the flexible display panel is the supporting structure 2 described above, another supporting structure 2 may also be separately disposed in two adjacent film layers of the flexible display panels. That is, the entire flexible display panel includes more than one film layer similar to the spring like structure. When the flexible display panel is bent, the probability of falling off or peeling off between layers of the flexible display panel after being bent multiple times are further reduced, the probability of display poorly of the flexible display panel are reduced, and the service life of the flexible display panel are increased.

In an embodiment of the present application, the module structure 3 further includes a touch layer disposed between the flexible cover layer 32 and the polarizer 31. By disposing the touch layer, the flexible display panel may have a touch function, which enriches experience of users.

In an embodiment of the present application, whether it is each film layer in the flexible display body 1 or each film layer in the module structure 3, two adjacent film layers may be bonded by an adhesive layer. However, whether two adjacent film layers need to be bonded by the adhesive layer may be selected according to actual application scenarios. For example, the adhesive layer may be disposed between the polarizer layer 31 and the flexible cover layer 32. Therefore, the present application does not limit whether the adhesive layer is disposed between two adjacent film layers in the flexible display panel.

In an embodiment of the present application, when the adhesive layer is disposed between two adjacent film layers in the flexible display panel, the adhesive material of the adhesive layer is a highly recoverable optically transparent adhesive (Optically Clear Adhesive, OCA) (hereinafter referred to as OCA). Since the material of the adhesive layer is highly recoverable OCA, the flexible display panel may be quickly restored to a flat state after being folded multiple times.

OCA has characteristics of colorless, transparent, light transmittance above 90%, good bonding strength, curing at room temperature and small curing shrinkage. By disposing OCA to bond two adjacent film layers, a stable bonding between two adjacent covering layers may be achieved without affecting the display effect of the flexible display body 1. When the adhesive layer is disposed between the polarizer layer 31 and the flexible cover layer 32, the adhesive material is highly recoverable OCA. When the flexible cover is impacted by an external force, OCA may also absorb and release part of the external force to reduce the impact of the external force on the flexible cover, further improve the impact resistance of the flexible cover, and thereby improve the impact resistance of the flexible display screen.

Another embodiment of the present application also provides a display device including a flexible display panel. The structure of the flexible display panel includes the structure of the flexible display panel described above. According to the flexible display panel included in the display device according to the embodiment of the present application, the supporting structure 2 is disposed between the flexible display body 1 and the module structure 3. The supporting structure 2 includes the plurality of supporting layers 22 disposed on a stack and the flexible layer 21 disposed between each two adjacent supporting layers 22. The angle α between at least one supporting layer 22 and the plane where the display surface of the flexible display body 1 is located is greater than 0° and less than 90°. An internal structure of the supporting structure 2 forms a spring like structure, the supporting layer 22 is equivalent to a spring bracket, and the flexible layer 21 is equivalent to a gap structure in middle of the spring bracket. When the flexible display panel is bent, the supporting structure 2 not only plays a supporting role, but also releases stress, thereby reducing a probability of falling off or peeling off between layers of the flexible display panel after being bent multiple times, reducing a probability of display poorly of the flexible display panel, and increasing a service life of the display device. In addition, a position of a neutral layer is adjusted, by disposing the supporting structure 2, and an easily broken position in the flexible display panel is disposed as the neutral layer, so that the easily broken position is neither pulled nor stressed, thereby reducing a risk of screen failure due to breakage.

Figure 15:
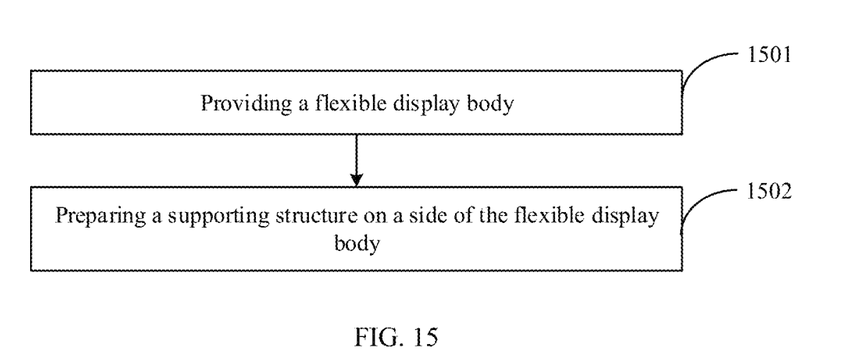
FIG. 15 is a flowchart of a method for preparing a flexible display panel according to an embodiment of the present application.

An embodiment of the present application also provides a method for preparing a flexible display panel. As shown in FIG. 15, the method for preparing includes the following steps.

Step 1501: providing a flexible display body.

Step 1502: preparing a supporting structure on a side of the flexible display body. The supporting structure includes a plurality of supporting layers disposed on a stack and a flexible layer disposed between each two adjacent supporting layers.

According to embodiments of the present application, the internal structure of the supporting structure forms a spring like structure, the supporting layer is equivalent to a spring bracket, and the flexible layer is equivalent to a gap structure in middle of the spring bracket. When the flexible display panel is bent, the supporting structure not only plays a supporting role, but also releases stress, thereby reducing a probability of falling off or peeling off between layers of the flexible display panel after being bent multiple times, reducing a probability of display poorly of the flexible display panel, and increasing a service life of the flexible display panel. In addition, a position of a neutral layer is adjusted, by disposing the supporting structure, and an easily broken position in the flexible display panel is disposed as the neutral layer, so that the easily broken position is neither pulled nor stressed, thereby reducing a risk of screen failure due to breakage.

Figure 16:
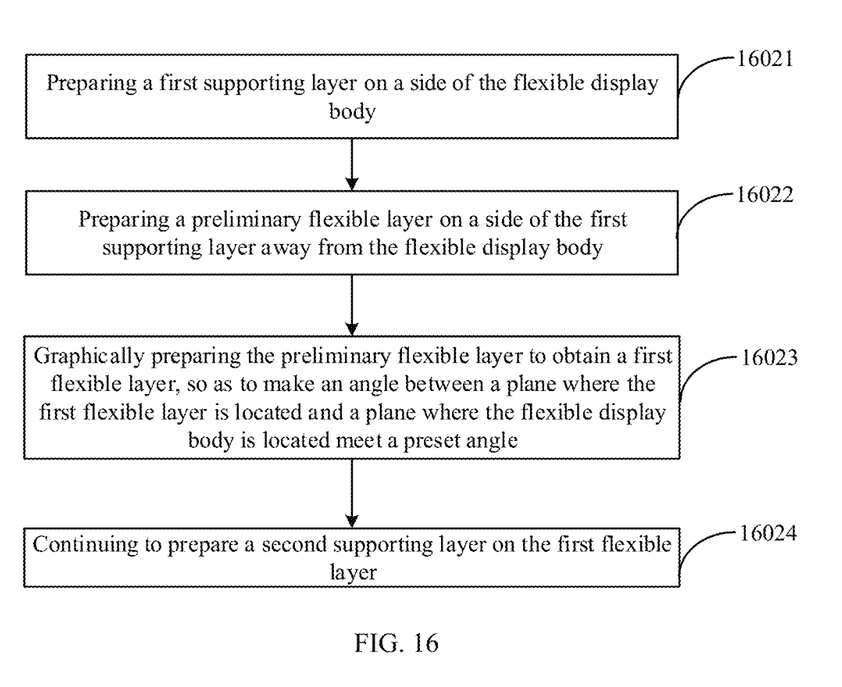
FIG. 16 is a flowchart of preparing a supporting structure in a method for preparing a flexible display panel according to an embodiment of the present application.

In an embodiment of the present application, as shown in FIG. 16, the preparing a supporting structure on one side of the flexible display body specifically includes the following steps.

Step 16021: preparing a first supporting layer on a side of the flexible display body.

Specifically, the flexible display body is a front-end structure prepared in a previous process. The first supporting layer is prepared on the display light emitting side of the flexible display body by chemical vapor deposition and particle sputtering. Optionally, the first supporting layer with a thickness from 20 nm to 50 nm is formed by depositing inorganic materials such as silicon oxide or silicon nitride on the display light emitting side of the flexible display body, or depositing metal materials such as titanium Ti or molybdenum Mo.

Step 16022: preparing a preliminary flexible layer on a side of the first supporting layer away from the flexible display body.

Specifically, the preliminary flexible layer is prepared on one side of the first supporting layer away from the flexible display body by a method such as coating. The preliminary flexible layer is a directly obtained non-patterned flexible layer. Optionally, the preliminary flexible layer is obtained by coating organic materials, PR or OC on one side of the first supporting layer away from the flexible display body.

Step 16023: graphically preparing the preliminary flexible layer to obtain a first flexible layer, so as to make an angle between a plane where the first flexible layer is located and a plane where the flexible display body is located meet a preset angle.

Specifically, the first flexible layer is obtained by graphically preparing the preliminary flexible layer, so that the angle between the plane where the first flexible layer is located and the plane where the flexible display body is located meets the preset angle. The preset angle is greater than 0° and less than 90°. Optionally, by cutting the preliminary flexible layer to pattern the preliminary flexible layer to obtain the first flexible layer, the angle between the plane where the first flexible layer is located and the plane where the flexible display body is located is 30°.

Step 16024: continuing to prepare a second supporting layer on the first flexible layer.

The second supporting layer is prepared on the surface of the first flexible layer by chemical deposition, vapor deposition and particle sputtering, etc. Since the angle between the surface of the first flexible layer and the plane where the flexible display body is located is greater than 0° and less than 90°, an angle between the second supporting layer and the plane where the flexible display body is located is greater than 0° and less than 90°. Optionally, the second supporting layer with a thickness from 20 nm to 50 nm is formed by depositing inorganic materials such as silicon oxide or silicon nitride on the display light emitting side of the flexible display body, or depositing metal materials such as titanium Ti or molybdenum Mo.

Optionally, if the supporting structure includes only one two-layer supporting layer and one flexible layer, after preparing the second supporting layer, the supporting structure is formed, and the display module is prepared on the display light emitting side of the second supporting layer.

Optionally, if the supporting structure 2 includes N supporting layers and N−1 flexible layers 21, after preparing the second supporting layer, repeat the above Step 16022, Step 16023, and Step 16024 to obtain N supporting layers and N−1 flexible layers to form the supporting structure. N is an integer greater than or equal to 3.

The above embodiments only the preferred embodiments of the present application, and are not intended to limit the present application. Any modification, equivalent replacement, etc. made within the spirit and principles of the present application should be included in the scope of protection of the present application.

What is claimed is:

1. A flexible display panel, comprising:
   a flexible display body; and
   a supporting structure disposed on a side of the flexible display body, wherein the supporting structure comprises a plurality of supporting layers disposed in a stack and a flexible layer disposed between each two adjacent supporting layers;
   and the plurality of supporting layers comprise a first supporting layer and a second supporting layer, wherein the first supporting layer faces the flexible display body, the second supporting layer faces away from the flexible display body, an angle between the first supporting layer and a plane defined by a display surface of the flexible display body is zero, and an angle between the second supporting layer and the plane is zero.

2. The flexible display panel according to claim 1, wherein the number of the plurality of supporting layers is N, and N is greater than or equal to 3;
   and an angle between at least one supporting layer of the plurality of supporting layers and the plane is greater than 0° and less than 90°.

3. The flexible display panel according to claim 1, wherein the plurality of supporting layers further comprise a third supporting layer, is located between the first supporting layer and the second supporting layer, and an angle between the third supporting layer and the plane is greater than 0° and less than 90°.

4. The flexible display panel according to claim 3, wherein an orthographic projection of the third supporting layer on the flexible display body covers at least a part of the flexible display body.

5. The flexible display panel according to claim 4, wherein the supporting structure further comprises:
   at least one supporting portion disposed between the first supporting layer and the second supporting layer, wherein an angle between the supporting portion and the plane is equal to 90°, and one end of the supporting portion is in contact with one end of the third supporting layer.

6. The flexible display panel according to claim 1, wherein a first angle between at least one supporting layer and the plane is greater than 0° and less than or equal to 5°.

7. The flexible display panel according to claim 1, wherein the plurality of supporting layers of comprise a selected supporting layer, an angle between the selected supporting layer and the plane is greater than 0° and less than 90°, and a cross section of the selected supporting layer in a thickness direction of the flexible display panel is either a curved surface or a flat surface.

8. The flexible display panel according to claim 1, wherein a thickness of each of the plurality of supporting layers is in a range from 20 nm to 50 nm.

9. The flexible display panel according to claim 1, wherein the flexible display body comprises a display device layer and an encapsulation layer disposed on a side of the display device layer, each of the plurality of supporting layers is an inorganic material layer or a metal layer, and the flexible layer is an organic material layer.

10. The flexible display panel according to claim 9, wherein the encapsulation layer comprises the supporting structure, and
    the encapsulation layer further comprises a plurality of first inorganic layers disposed in a stack and a first organic layer disposed between each two adjacent first inorganic layers, wherein an angle between at least one first inorganic layer in the plurality of first inorganic layers and a display surface of the display device layer is greater than 0° and less than 90°.

11. The flexible display panel according to claim 9, wherein the encapsulation layer comprises the supporting structure,
    the encapsulation layer comprises three first inorganic layers disposed in a stack and two first organic layers interleaved between the first inorganic layers, and an angle between a first inorganic layer in a middle of the three first inorganic layers and a display surface of the display device layer is greater than 0° and less than 90°.

12. The flexible display panel according to claim 9, further comprising a module structure located on a side of the encapsulation layer, wherein the module structure comprises a flexible cover layer.

13. The flexible display panel according to claim 12, wherein the flexible cover layer comprises the supporting structure and comprises a plurality of second inorganic layers disposed in a stack and a second organic layer disposed between each two adjacent second inorganic layers, wherein an angle between at least one second inorganic layer in the plurality of second inorganic layers and a plane where a non-luminous surface of a polarizer layer is located is greater than 0° and less than 90°.

14. The flexible display panel according to claim 12, wherein the flexible cover layer comprises the supporting structure, the flexible cover layer comprises three second inorganic layers disposed in a stack and two second organic layers disposed between each two adjacent second inorganic layers, and an angle between a second inorganic layer in a middle of the three second inorganic layers and a plane where a non-luminous surface of a polarizer layer is located is greater than 0° and less than 90°.

15. The flexible display panel according to claim 9, further comprising a flexible substrate on a side of the display device layer away from the encapsulation layer, wherein the flexible substrate comprises the supporting structure.

16. The flexible display panel according to claim 1, further comprising a module structure disposed on a side of the supporting structure away from the flexible display body.

17. A display device, comprising:
a flexible display panel according to claim 1.

18. A flexible display panel, comprising:
a flexible display body; and
a supporting structure disposed on a side of the flexible display body, wherein the supporting structure comprises a plurality of supporting layers disposed in a stack and a flexible layer disposed between each two adjacent supporting layers; the plurality of supporting layers of the supporting structure comprise a first supporting layer and a second supporting layer, the first supporting layer faces the flexible display body, the second supporting layer faces away from the flexible display body; the plurality of supporting layers and the flexible layer are sequentially disposed in a direction perpendicular to a plane defined by a display surface of the flexible display body; and wherein an orthographic projection of at least two supporting layers in a direction perpendicular to the plane completely overlap.

19. The flexible display panel according to claim 18, wherein the flexible display body comprises a display device layer and the flexible display panel further comprises an encapsulation layer disposed on a side of the display device layer.

20. The flexible display panel according to claim 18, further comprising:
a module structure, wherein the module structure is disposed on a side, facing away from the flexible display body, of the supporting structure.

* * * * *